United States Patent
Hsiao et al.

(10) Patent No.: US 11,967,395 B2
(45) Date of Patent: Apr. 23, 2024

(54) BUFFERS AND MULTIPLEXERS

(71) Applicant: MEDIATEK INC., Hsinchu (TW)

(72) Inventors: Shuo-Yuan Hsiao, Hsinchu (TW); Chao-Chun Sung, Hsinchu (TW); Chieh-En Yu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 639 days.

(21) Appl. No.: 17/141,429

(22) Filed: Jan. 5, 2021

(65) Prior Publication Data

US 2022/0215864 A1 Jul. 7, 2022

(51) Int. Cl.
*H02J 3/00* (2006.01)
*G11C 7/10* (2006.01)
*G11C 7/22* (2006.01)
*H04B 5/00* (2006.01)
*H04B 1/40* (2015.01)

(52) U.S. Cl.
CPC .......... *G11C 7/1057* (2013.01); *G11C 7/1063* (2013.01); *G11C 7/22* (2013.01); *H04B 5/00* (2013.01); *H02J 3/00125* (2020.01); *H04B 1/40* (2013.01)

(58) Field of Classification Search
CPC ....... G11C 7/1063; H02J 3/00125; H04B 5/00
See application file for complete search history.

(56) References Cited

U.S. PATENT DOCUMENTS

| | | | |
|---|---|---|---|
| 6,552,596 B2 | 4/2003 | Cowles et al. | |
| 6,885,226 B2 | 4/2005 | Waldrop | |
| 7,348,794 B2 | 3/2008 | Tanaka | |
| 8,588,713 B2 * | 11/2013 | Khlat | H03G 3/3047 330/297 |
| 9,301,046 B1 * | 3/2016 | Das | H04R 3/04 |
| 11,463,053 B1 * | 10/2022 | Znojemsky | H03F 3/68 |
| 2010/0280577 A1 * | 11/2010 | Roy | A61N 1/378 323/280 |
| 2013/0076436 A1 * | 3/2013 | Chiaburu | H04L 25/0278 330/105 |
| 2018/0076780 A1 * | 3/2018 | Wang | H03F 1/56 |
| 2020/0321944 A1 * | 10/2020 | Nomura | H04L 25/029 |

FOREIGN PATENT DOCUMENTS

EP 2 491 656 B1 9/2017

OTHER PUBLICATIONS

Chinese language office action dated Mar. 14, 2023, issued in application No. TW 110128832.

* cited by examiner

*Primary Examiner* — Patricia T Nguyen
(74) *Attorney, Agent, or Firm* — McClure, Qualey & Rodack, LLP

(57) ABSTRACT

A buffer circuit and a multiplexer using the buffer are provided. The buffer may selectively operate at a first mode or a second mode. The buffer includes a first signal input terminal, a first signal output terminal, and a path circuit coupled between the first signal input terminal and the first signal output terminal. The path circuit has a voltage source terminal. In response to the buffer operating at the first mode, a first signal transmission path is formed in the path circuit and between the first signal input terminal and the first signal output terminal. The first signal transmission path is disconnected from the voltage source terminal.

20 Claims, 20 Drawing Sheets

BUFFERS AND MULTIPLEXERS

BACKGROUND OF THE INVENTION

Field of the Invention

The invention relates to a buffer circuit, and more particularly to a dual-mode buffer circuit.

Description of the Related Art

Modern high speed serial link devices are required to operate at a reduced data rate for backward compatibility. However, these devices may consume similar amount of DC (direct current) power at both a low data rate operation and a high data rate operation, which is not in line with general power management strategy at a low data rate operation or a low operation frequency. Thus, it is desired to provide a solution to adaptability switch a high-speed device a reduced power mode at a low data rate operation or a low operation frequency.

BRIEF SUMMARY OF THE INVENTION

An exemplary embodiment of a buffer is provided. The buffer may selectively operate at a first mode or a second mode. The buffer comprises a first signal input terminal, a first signal output terminal, and a path circuit coupled between the first signal input terminal and the first signal output terminal. The path circuit has a voltage source terminal. In response to the buffer operating at the first mode, a first signal transmission path is formed in the path circuit and between the first signal input terminal and the first signal output terminal. The first signal transmission path is disconnected from the voltage source terminal.

One exemplary embodiment of a multiplexer is provided. The multiplexer selectively operates at a first selection state or a second selection state and selectively operates at a first transmission mode or a second mode. The multiplexer comprises a first signal input terminal, a second signal input terminal, a first signal output terminal, and a path circuit coupled between the first and second signal input terminals and the first signal output terminal. The path circuit has voltage source terminal. In response to the buffer operating simultaneously at the first selection state and at the first transmission mode, a first signal transmission path is formed in the path circuit and between the first signal input terminal and the first signal output terminal, and the first signal transmission path is disconnected from the voltage source terminal. In response to the buffer operating simultaneously at the second selection state and at the first transmission mode, a second signal transmission path is formed in the path circuit and between the second signal input terminal and the first signal output terminal, and the second signal transmission path is disconnected from the voltage source terminal.

Another exemplary embodiment of a multiplexer is provided. The multiplexer selectively operates at a first selection state or a second selection state and selectively operates at a first transmission mode or a second mode. The multiplexer comprises a first signal input terminal, a first signal output terminal, a second signal output terminal, and a path circuit coupled between the first signal input terminal and the first and second signal output terminals. The path circuit has a voltage source terminal. In response to the buffer operating simultaneously at the first selection state and at the first transmission mode, a first signal transmission path is formed in the path circuit and between the first signal input terminal and the first signal output terminal, and the first signal transmission path is disconnected from the voltage source terminal. In response to the buffer operating simultaneously at the second selection state and at the first transmission mode, a second signal transmission path is formed in the path circuit and between the first signal input terminal and the second signal output terminal, and the second signal transmission path is disconnected from the voltage source terminal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
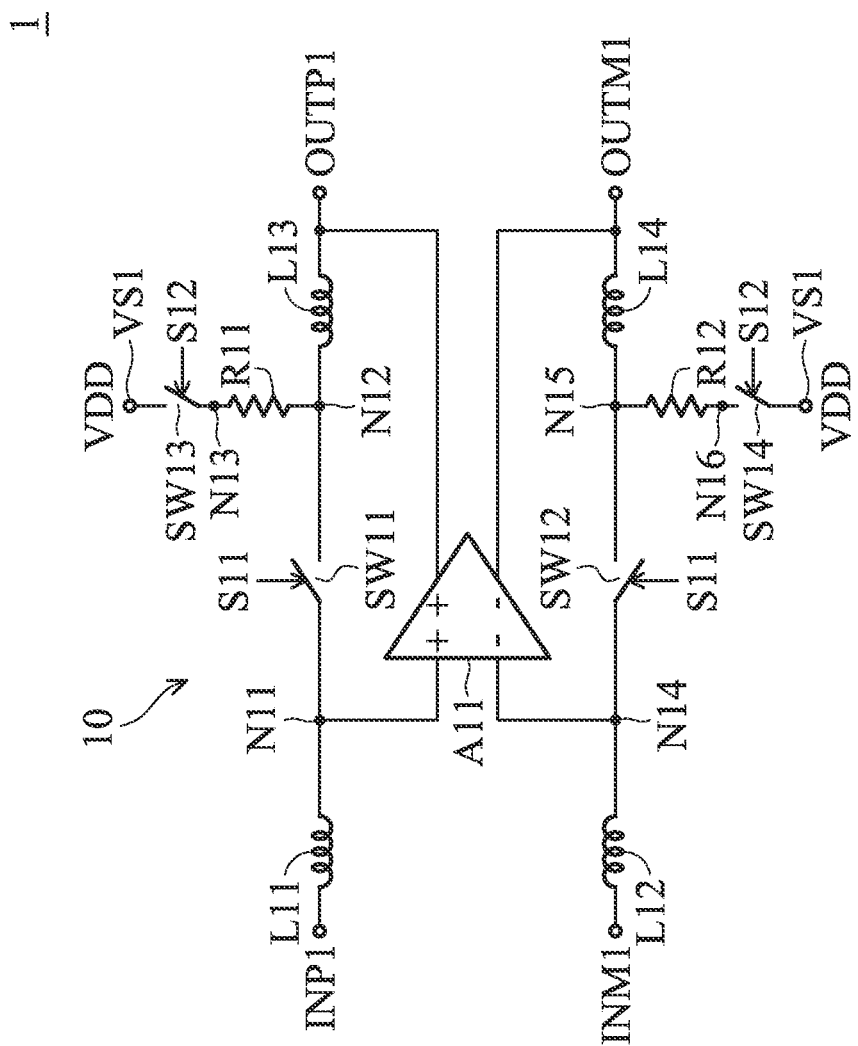
FIGS. 1A~1B show an exemplary embodiment of a buffer.

FIG. 1A shows an exemplary embodiment of a buffer. As shown in FIG. 1, the buffer 1 comprises two signal input terminals INP1 and INM1, two signal output terminals OUTN1 and OUTM1, and a path circuit 10. The signal input terminals INP1 and INM1 are pair of input terminals for receiving a differential input signal, wherein a positive element signal of the differential input signal is received by the signal input terminal INP1, while a negative element signal of the differential input signal is received by the signal input terminal INM1. The buffer 1 may selectively operate at a passive mode or an active mode according to the frequency of the differential input signal. When the data rate of the differential input signal is high, the buffer 1 operates at the active; when the data rate of the differential input signal is low, the buffer 1 operates at the passive mode for reducing consumption. The buffer 1 generates a differential output signal at the signal output terminals OUTN1 and OUTM1 according to the received differential input signal. The path circuit 10 comprises inductors L11~L14, switches SW11~SW14, resistors R11~R12, and an amplifier A11. The inductor L11 is coupled between the signal input terminal INP1 and a node N11. The switch SW11 is coupled between the node N11 and a node N12. The inductor L13 is coupled between the node N12 and the signal output terminal OUTP1. The switch SW13 is coupled between the voltage source terminal VS1 and a node N13. During the operation of the buffer 1, an operation voltage VDD is provided to the voltage source terminal VS1. The resistor R11 is coupled between the node N13 and the node N12. The inductor L12 is coupled between the signal input terminal INM1 and the node N14. The switch SW12 is coupled between the node N14 and a node N15. The inductor L14 is coupled between the node N15 and the signal output terminal OUTM1. The switch SW14 is coupled between the voltage source terminal VS1 and a node N16. The resistor R12 is coupled between the node N16 and the node N15. A positive input terminal (+) of the amplifier A11 is coupled to the node N11, and a negative input terminal (−) thereof is coupled to the node N14. A positive output terminal (+) of the amplifier A11 is coupled to the signal output terminal OUTP1, and a negative output terminal (−) thereof is coupled to the signal output terminal OUTM1.

In the embodiment, the switches SW11 and SW12 are controlled by a switch signal S11, while the switches SW13 and SW14 are controlled by a switch signal S12. The buffer 1 may further comprise a signal generator 11 which operates to generate the switch signal S11 and 12 based on a mode signal MODE1 In an embodiment, the switch signals S11 and S12 are out of phase. In other words, the duration when the switches SW11 and SW12 does not overlap the duration when the switches SW13 and SW14. The mode signal MODE1 indicates which one of the passive mode and the active mode the buffer 1 operates at.

Figure 2A:
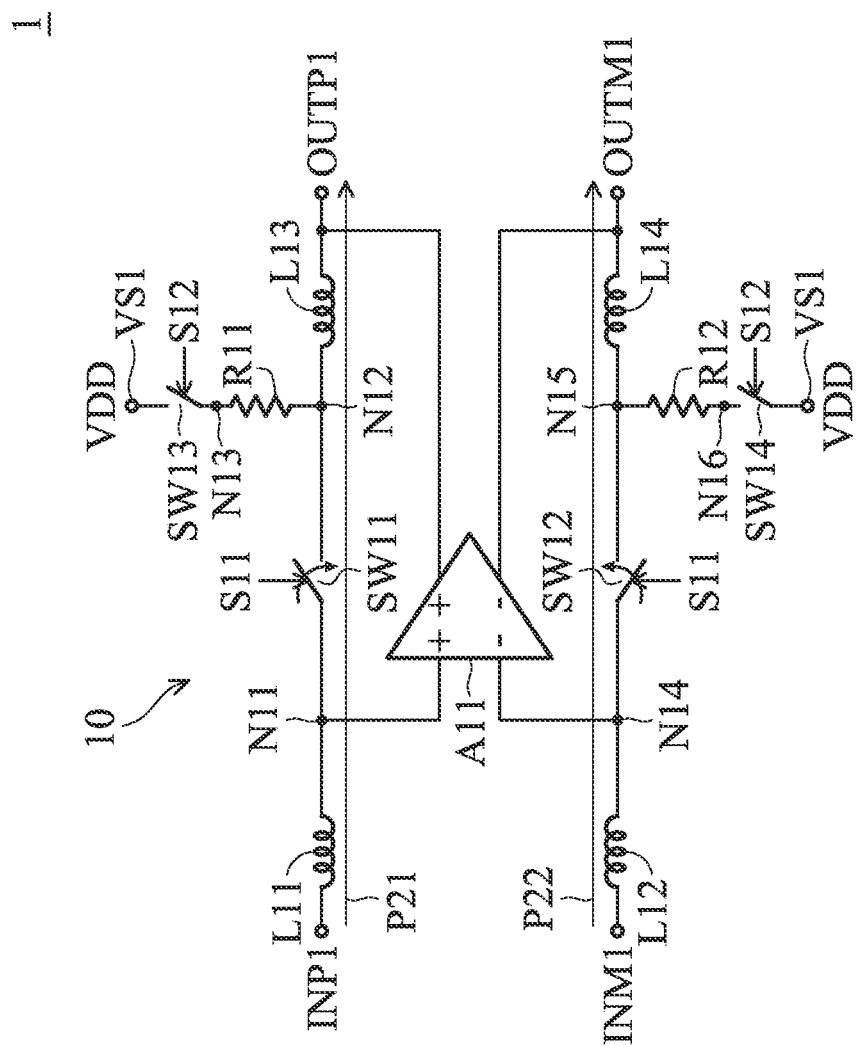
FIGS. 2A~2B shows an exemplary embodiment of an operation of the buffer of FIG. 1 at a passive mode and an active mode.

Referring to FIG. 2A, when the buffer 1 operates at the passive mode, the switches SW11 and SW12 are turned on according to the switch signal S11, while the switches SW13 and SW14 are turned off according to the switch signal S12. Moreover, the amplifier A11 is disabled. Since the switch SW11 is turned on, there is a signal transmission path P21 is formed in the path circuit 10 and between the signal input terminal INP1 and the signal output terminal OUTP1 for the positive element signal of the differential input signal. Since the switch SW12 is turned on, there is a signal transmission path P22 is formed in the path circuit 10 and between the signal input terminal INM1 and the signal output terminal OUTM1 for the negative element signal of the differential input signal. As shown in FIG. 2A, the switches SW13 and SW14 are turned off, and each of the signal transmission paths P21 and P22 is disconnected from the voltage source terminal VS1. The components L11~L14 and SW11~SW12 in the signal transmission paths P21 and P22 are passive elements. Thus, no direct current (DC) power consumption is required at the passive mode.

Figure 2B:
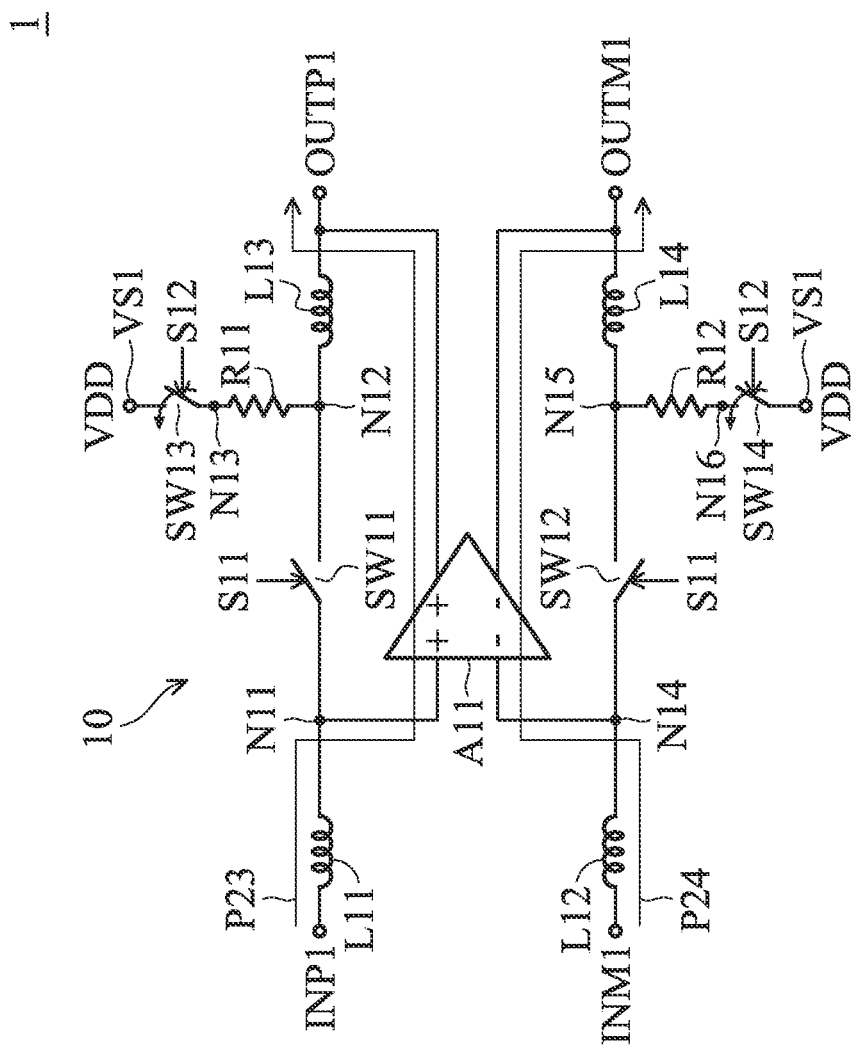

Referring to FIG. 2B, when the buffer 1 operates at the active mode, the switches SW11 and SW12 are turned off according to the switch signal S11, while the switches SW13 and SW14 are turned on according to the switch signal S12. Moreover, the amplifier A11 is enabled. Since the switch SW11 is turned off and the amplifier A11 is enabled, there is a signal transmission path P23 is formed in the path circuit 10 and between the signal input terminal INP1 and the signal output terminal OUTP1 for the positive element signal of the differential input signal. Since the switch SW12 is turned off and the amplifier A11 is enabled, there is a signal transmission path P24 is formed in the path circuit 10 and between the signal input terminal INM1 and the signal output terminal OUTM1 for the negative element signal of the differential input signal. As shown in FIG. 2B, the switches SW13 and SW14 are turned on. Thus, a DC current is provided from the voltage source terminal VS1 to the signal transmission path P23 through the switch SW13, the resistor R11 and the inductor L13, and a DC current is provided from the voltage source terminal VS1 to the signal transmission path P24 through the switch SW14, the resistor R12 and the inductor L14, which induces DC power consumption.

According to the above embodiment, the buffer 1 can selectively operate at two different modes: a passive mode and an active mode. In cases where the buffer 1 is applied in a high speed device, when the high speed device operates a low data rate for a low frequency signal, the buffer 1 switches to operate at the passive mode to provide a specific signal transmission path for the low frequency signal. The specific signal transmission path is disconnected from the voltage source terminal VS1, and only passive components are in the specific signal transmission path. Thus, no DC current is induced, which eliminates DC power consumption.

Figure 1B:
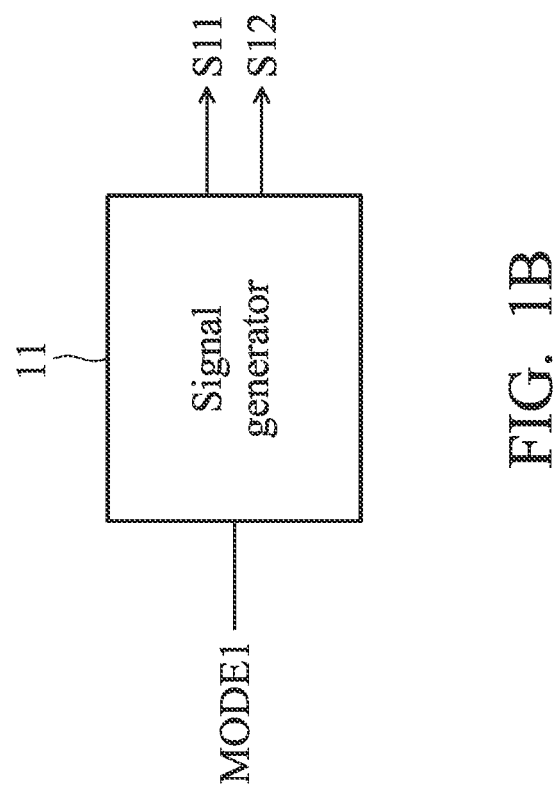
Figure 3A:
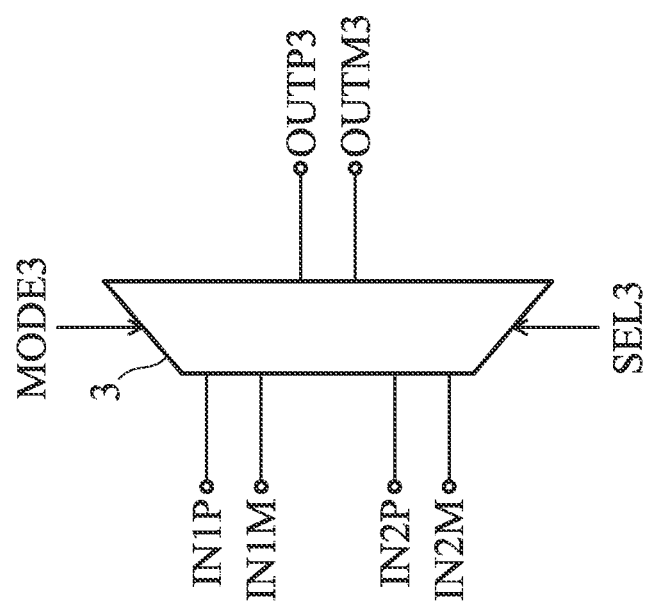
FIGS. 3A~3C show one exemplary embodiment of a two-to-one multiplexer.
Figure 3B:
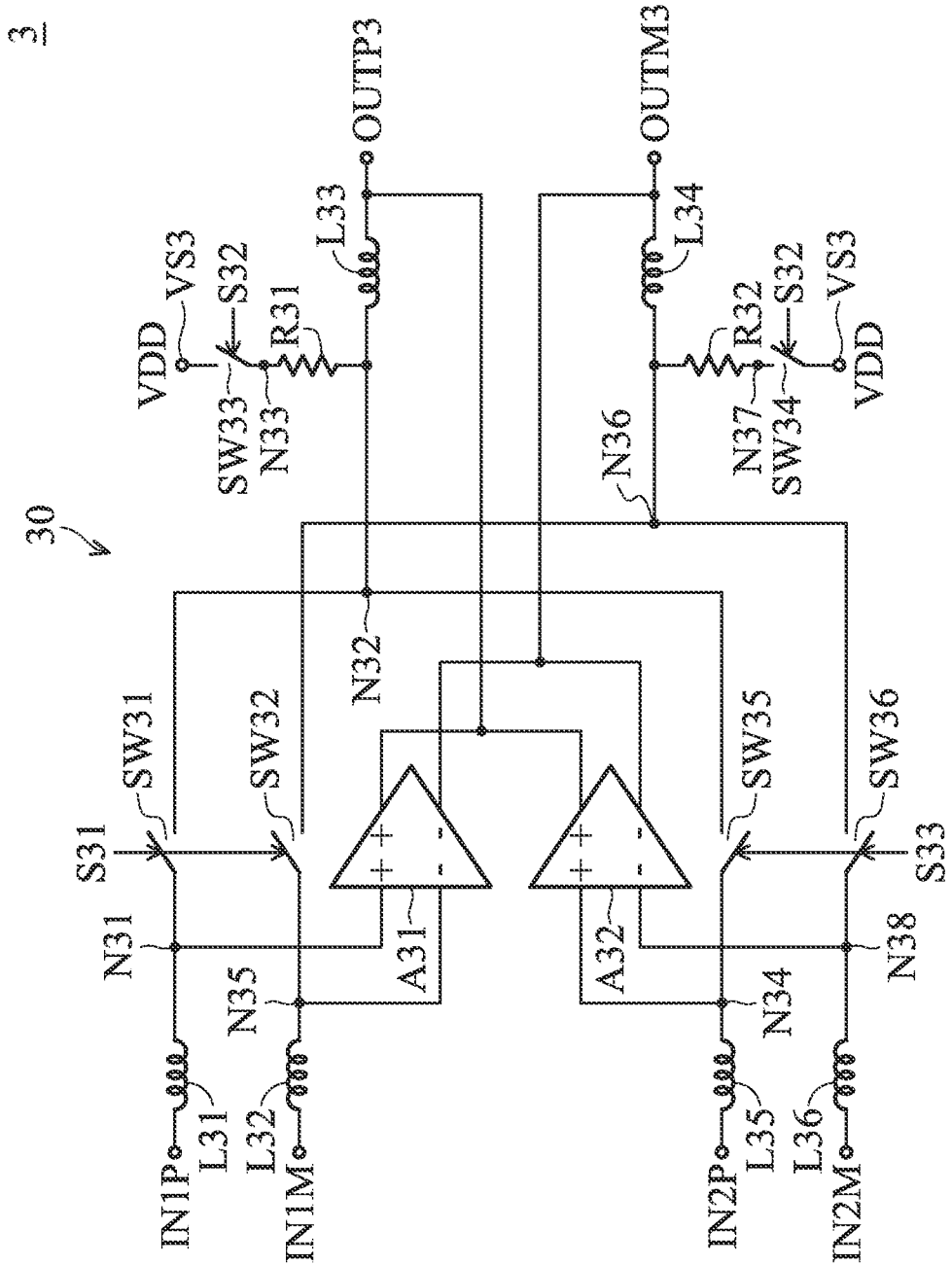
Figure 3C:
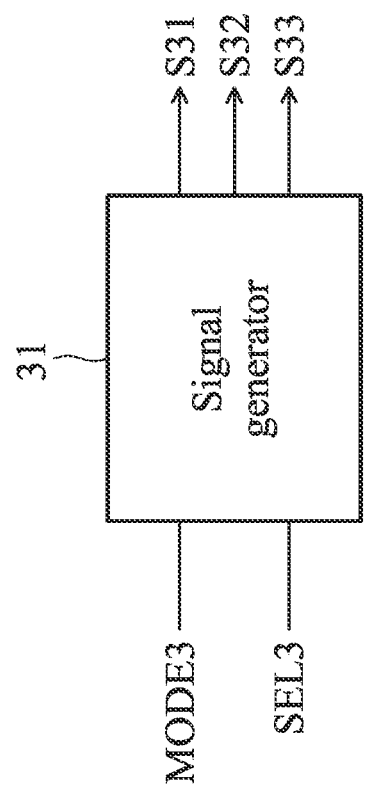

In an embodiment, the structure and operation of the buffer shown in FIGS. 1A~1B can applied in a two-to-one multiplexer. FIGS. 3A~3B show an exemplary embodiment of a two-to-one multiplexer. As shown in FIG. 3A, a two-to-one multiplexer 3 comprises a pair of signal input terminals IN1P and IN1M, a pair of signal input terminals IN2P and IN2M, a pair of signal output terminal OUTP3 and OUTM3, and a path circuit 30. The signal input terminals IN1P and IN1M are configured to receive a differential input signal, wherein a positive element signal of this differential input signal is received by the signal input terminal IN1P, while a negative element signal thereof is received by the signal input terminal IN1M. The signal input terminals IN2P and IN2M are configured to receive another differential input signal, wherein a positive element signal of this differential input signal is received by the signal input terminal IN2P, while a negative element signal thereof is received by the signal input terminal IN2M. According to a selection signal SEL3, the two-to-one multiplexer 3 operates at a first selection state to select the differential input signal at the pair of signal input terminals IN1P and IN1M or at a second selection state to select the differential input signal at the pair of signal input terminals IN2P and IN2M and then transmits the selected differential input signal to the pair of signal output terminal OUTP3 and OUTM3 as a differential output signal. Moreover, the two-to-one multiplexer 3 may be controlled by a mode signal MODE3 to selectively operate at a passive mode or an active mode according to the frequency of the selected differential input signal. When the data rate of the selected differential input signal is high, the two-to-one multiplexer 3 operates at the active; when the data rate of the selected differential input signal is low, the two-to-one multiplexer 3 operates at the passive mode for reducing consumption.

Referring to FIG. 3B, the path circuit 30 comprises inductors L31~L36, switches SW31~SW36, resistors R31~R32, and amplifiers A31~A32. The inductor L31 is coupled between the signal input terminal IN1P and a node N31. The switch SW31 is coupled between the node N31 and a node N32. The inductor L33 is coupled between the node N32 and the signal output terminal OUTP3. The switch SW33 is coupled between the voltage source terminal VS3 and a node N33. During the operation of the two-to-one multiplexer 3, an operation voltage VDD is provided to the voltage source terminal VS3. The resistor R31 is coupled between the node N33 and the node N32. The inductor L32 is coupled between the signal input terminal IN1M and the node N35. The switch SW32 is coupled between the node N35 and a node N36. The inductor L34 is coupled between the node N36 and the signal output terminal OUTM3. The switch SW34 is coupled between the voltage source terminal VS3 and a node N37. The resistor R32 is coupled between the node N37 and the node N36. A positive input terminal (+) of the amplifier A31 is coupled to the node N31, and a negative input terminal (−) thereof is coupled to the node N35. A positive output terminal (+) of the amplifier A31 is coupled to the signal output terminal OUTP3, and a negative output terminal (−) thereof is coupled to the signal output terminal OUTM3.

The inductor L35 is coupled between the signal input terminal IN2P and a node N34. The switch SW35 is coupled between the node N34 and the node N32. The inductor L36 is coupled between the signal input terminal IN2M and a node N38. The switch SW36 is coupled between the node N38 and the node N36. A positive input terminal (+) of the amplifier A32 is coupled to the node N34, and a negative input terminal (−) thereof is coupled to the node N38. A positive output terminal (+) of the amplifier A32 is coupled to the signal output terminal OUTP3, and a negative output terminal (−) thereof is coupled to the signal output terminal OUTM3.

In the embodiment, the switches SW31 and SW32 are controlled by a switch signal S31, the switches SW33 and SW34 are controlled by a switch signal S32, and the switches SW35 and SW36 are controlled by a switch signal S33. The two-to-one multiplexer 3 may further comprise a signal generator 31 which operates to generate the switch signal S31~S33 based on the selection signal SEL3 and the mode signal MODE3. The selection signal SEL3 indicates which differential input signal is selected, and the mode signal MODE3 indicates which one of the passive mode and the active mode the two-to-one multiplexer 3 operates at according to the frequency of the selected differential input signal.

Figure 4A:
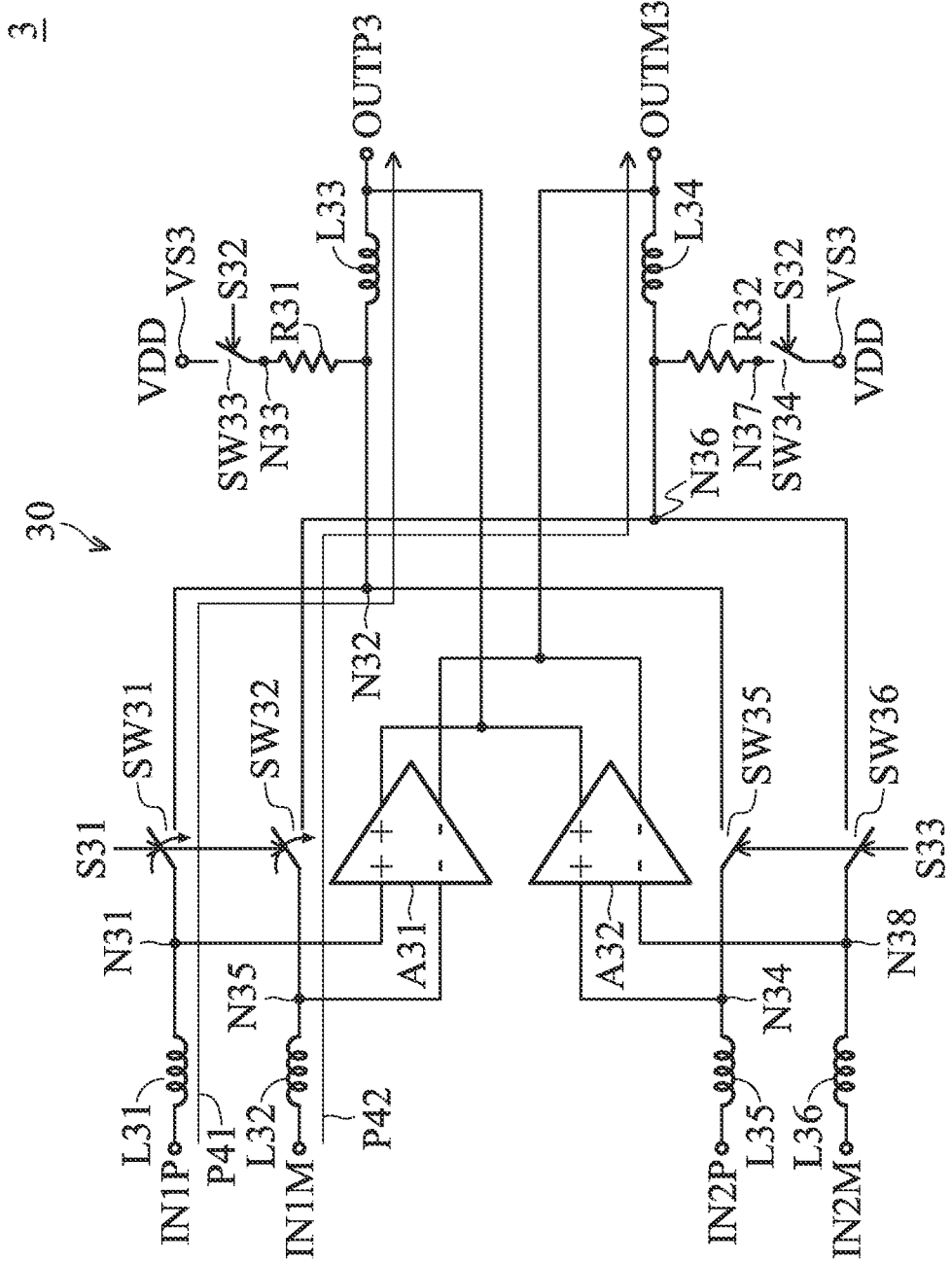
FIGS. 4A~4D shows an exemplary embodiment of an operation of the two-to-one multiplexer of FIGS. 3A~3C at a passive mode and an active mode.

Referring to FIG. 4A, when the two-to-one multiplexer 3 operates simultaneously at the first selection state (for selecting the differential input signal at the pair of signal input terminals IN1P and IN1M) and at the passive mode, the switches SW31 and SW32 are turned on according to the switch signal S31, the switches SW33 and SW34 are turned off according to the switch signal S32, and the switches SW35 and SW36 are turned off according to the switch signal S33. Moreover, the amplifier A31 and A32 are disabled. Since the switches SW31 is turned on, there is a signal transmission path P41 is formed in the path circuit 30 and between the signal input terminal IN1P and the signal output terminal OUTP3 for the positive element signal of the differential input signal at the signal input terminal IN1P. Since the switch SW32 is turned on, there is a signal transmission path P42 is formed in the path circuit 30 and between the signal input terminal IN1M and the signal output terminal OUTM3 for the negative element signal at the signal input terminal IN1M. As shown in FIG. 4A, the switches SW33 and SW34 are turned off, and each of the signal transmission paths P41 and P42 is disconnected from the voltage source terminal VS3. The components L31~L34 and SW31~SW32 in the signal transmission paths P41 and P42 are passive elements. Thus, no DC power consumption is required simultaneously at the first selection state and at the passive mode.

Figure 4B:
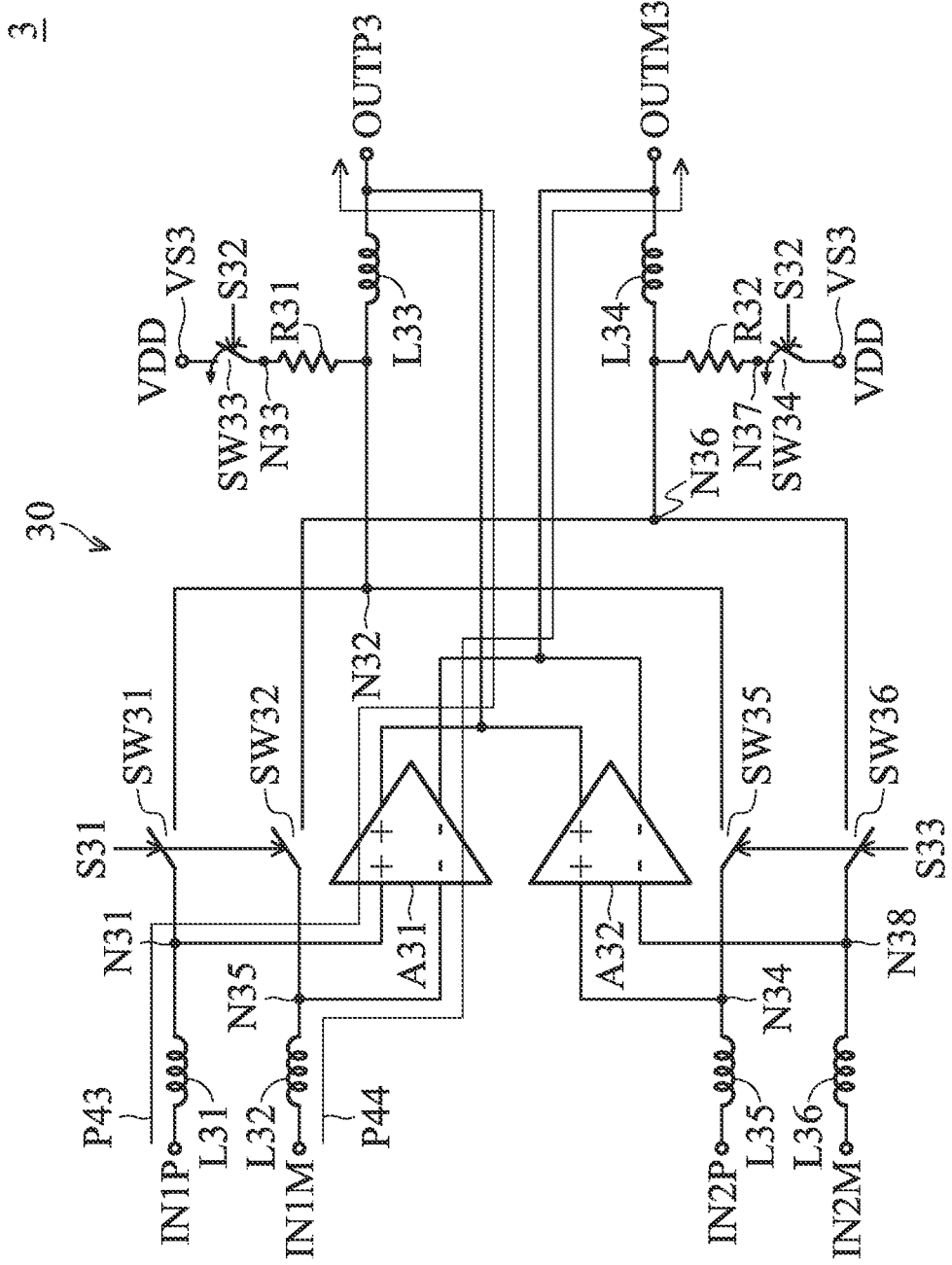

Referring to FIG. 4B, when the two-to-one multiplexer 3 operates simultaneously at the first selection state and at the active mode, the switches SW31 and SW32 are turned off according to the switch signal S31, the switches SW33 and SW34 are turned on according to the switch signal S32, and the switches SW35 and SW36 are turned off according to the switch signal S33. Moreover, the amplifier A31 is enabled, while the amplifier A32 is disabled. Since the switch SW31 is turned off and the amplifier A31 is enabled, there is a signal transmission path P43 is formed in the path circuit 30 and between the signal input terminal IN1P and the signal output terminal OUTP3 for the positive element signal at the signal input terminal IN1P. Since the switch SW32 is turned off and the amplifier A31 is enabled, there is a signal transmission path P44 is formed in the path circuit 30 and between the signal input terminal IN1M and the signal output terminal OUTM3 for the negative element signal at the signal input terminal IN1M. As shown in FIG. 4B, the switches SW33 and SW34 are turned on. Thus, a DC current is provided from the voltage source terminal VS3 to the signal transmission path P43 through the switch SW33, the resistor R31 and the inductor L33, and a DC current is provided from the voltage source terminal VS3 to the signal transmission path P44 through the switch SW34, the resistor R32 and the inductor L34, which induces DC power consumption.

Figure 4C:
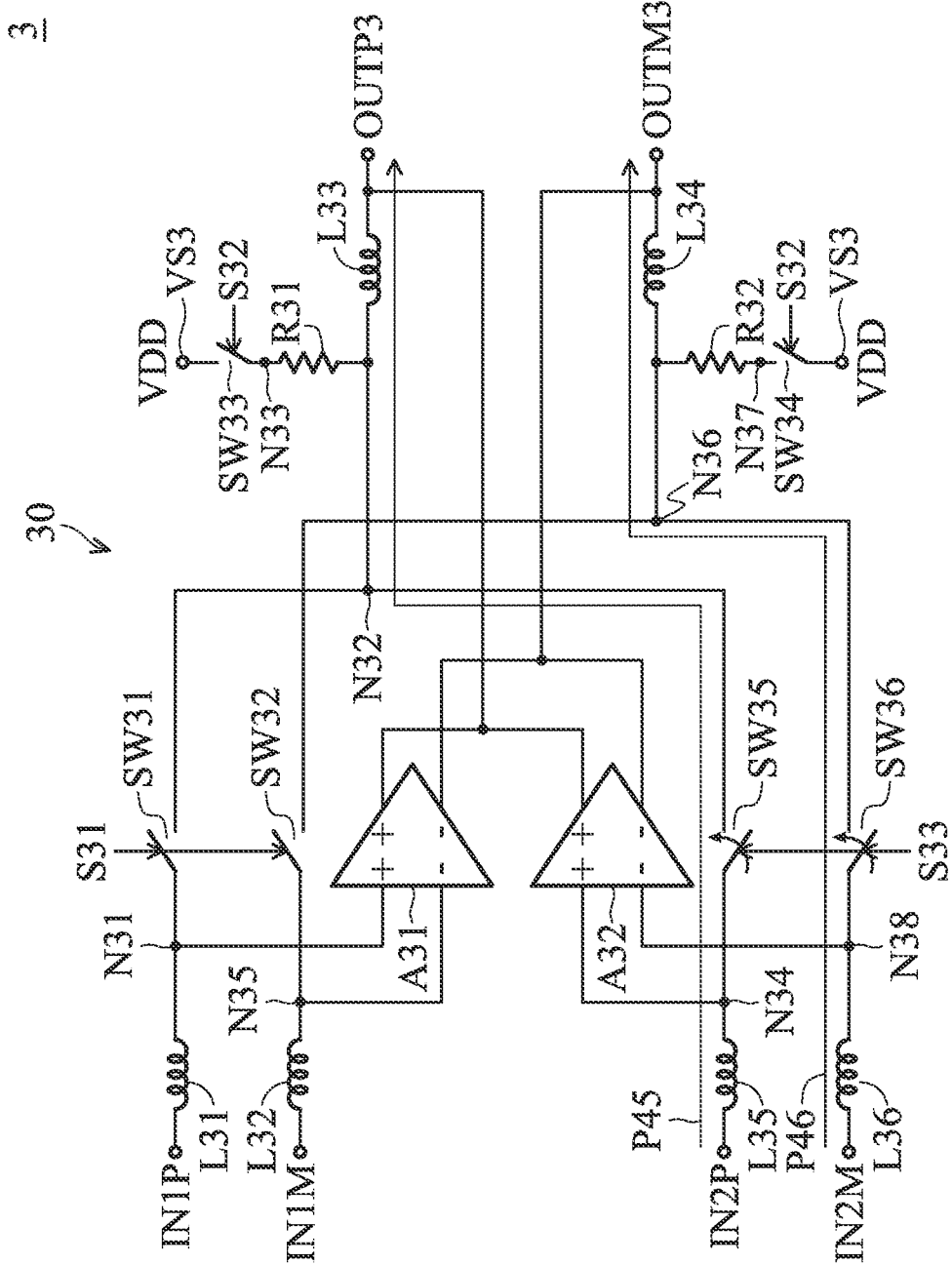

Referring to FIG. 4C, when the two-to-one multiplexer 3 operates simultaneously at the second selection state (for selecting the differential input signal at the pair of signal input terminals IN2P and IN2M) and at the passive mode, the switches SW35 and SW36 are turned on according to the switch signal S33, the switches SW33 and SW34 are turned off according to the switch signal S32, and the switches SW31 and SW32 are turned off according to the switch signal S31. Moreover, the amplifier A31 and A32 are disabled. Since the switches SW35 is turned on, there is a signal transmission path P45 is formed in the path circuit 30 and between the signal input terminal IN2P and the signal output terminal OUTP3 for the positive element signal of the differential input signal at the signal input terminals IN2P. Since the switch SW36 is turned on, there is a signal transmission path P46 is formed in the path circuit 30 and between the signal input terminal IN2M and the signal output terminal OUTM3 for the negative element signal at the signal input terminal IN2M. As shown in FIG. 4C, the switches SW33 and SW34 are turned off, and each of the signal transmission paths P45 and P46 is disconnected from the voltage source terminal VS3. The components L33~L36 and SW35~SW36 in the signal transmission paths P45 and P46 are passive elements. Thus, no DC power consumption is required simultaneously at the first selection state and at the passive mode.

Figure 4D:
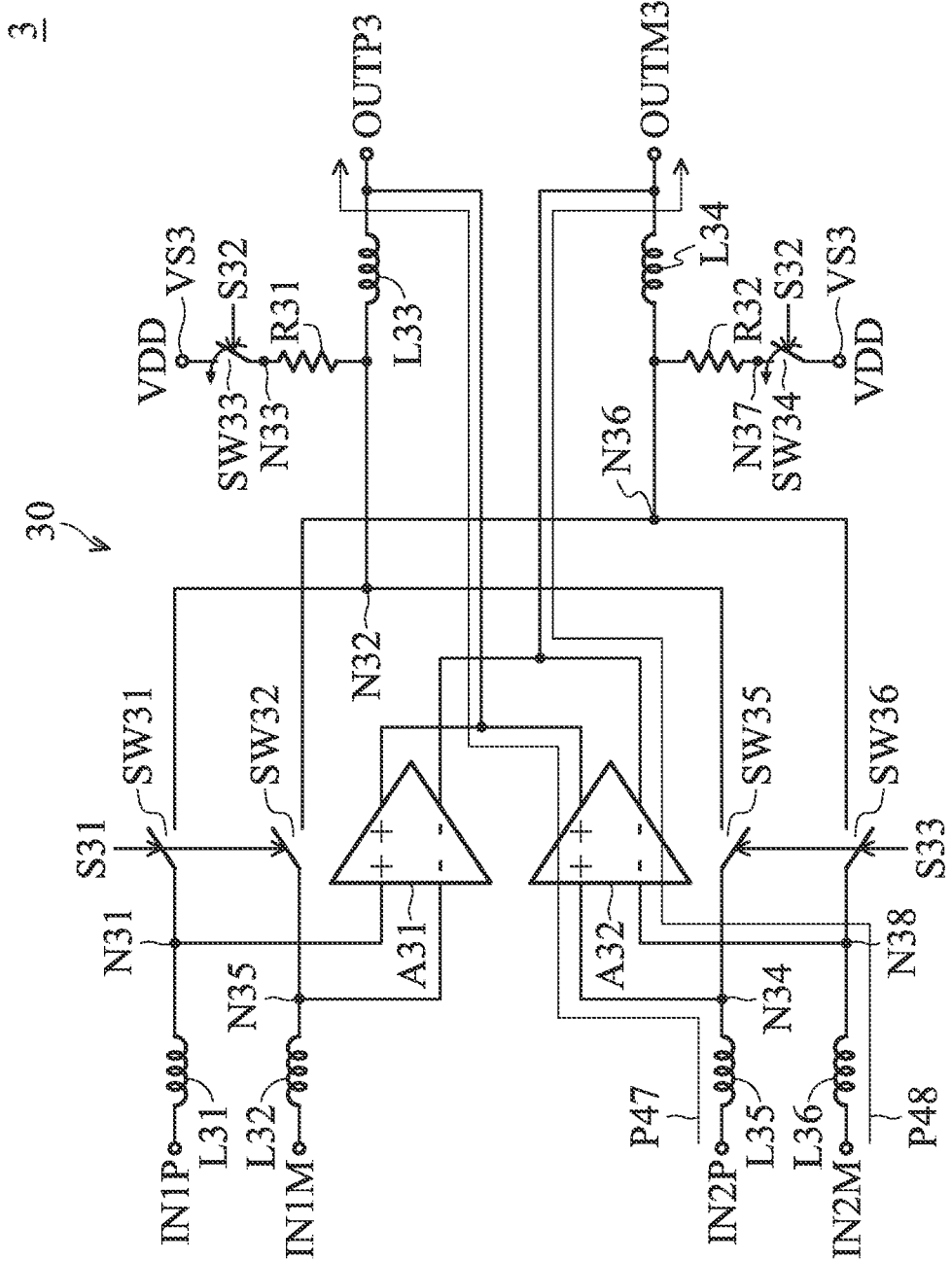

Referring to FIG. 4D, when the two-to-one multiplexer 3 operates simultaneously at the second selection state and at the active mode, the switches SW35 and SW36 are turned off according to the switch signal S33, the switches SW33 and SW34 are turned on according to the switch signal S32, and the switches SW31 and SW32 are turned off according to the switch signal S31. Moreover, the amplifier A32 is enabled, while the amplifier A31 is disabled. Since the switch SW35 is turned off and the amplifier A32 is enabled, there is a signal transmission path P47 is formed in the path circuit 30 and between the signal input terminal IN2P and the signal output terminal OUTP3 for the positive element signal at the signal input terminal IN2P. Since the switch SW36 is turned off and the amplifier A32 is enabled, there is a signal transmission path P48 is formed in the path circuit 30 and between the signal input terminal IN2M and the signal output terminal OUTM3 for the negative element signal at the signal input terminal IN2M. As shown in FIG. 4D, the switches SW33 and SW34 are turned on. Thus, a DC current is provided from the voltage source terminal VS3 to the signal transmission path P47 through the switch SW33, the resistor R31 and the inductor L33, and a DC current is provided from the voltage source terminal VS3 to the signal transmission path P48 through the switch SW34, the resistor R32 and the inductor L34, which induces DC power consumption.

According to the above embodiment, the two-to-one multiplexer 3 can selectively operate at two different modes: a passive mode and an active mode. In cases where the two-to-one multiplexer 3 is applied in a high speed device, when the high speed device operates a low data rate for a low frequency differential input signal, the two-to-one multiplexer 3 switches to operate at the passive mode to provide a specific signal transmission path for the low frequency differential input signal. The specific signal transmission path is disconnected from the voltage source terminal VS3, and only passive components are in the specific signal transmission path. Thus, no DC current is induced, which eliminates DC power consumption.

Figure 5:
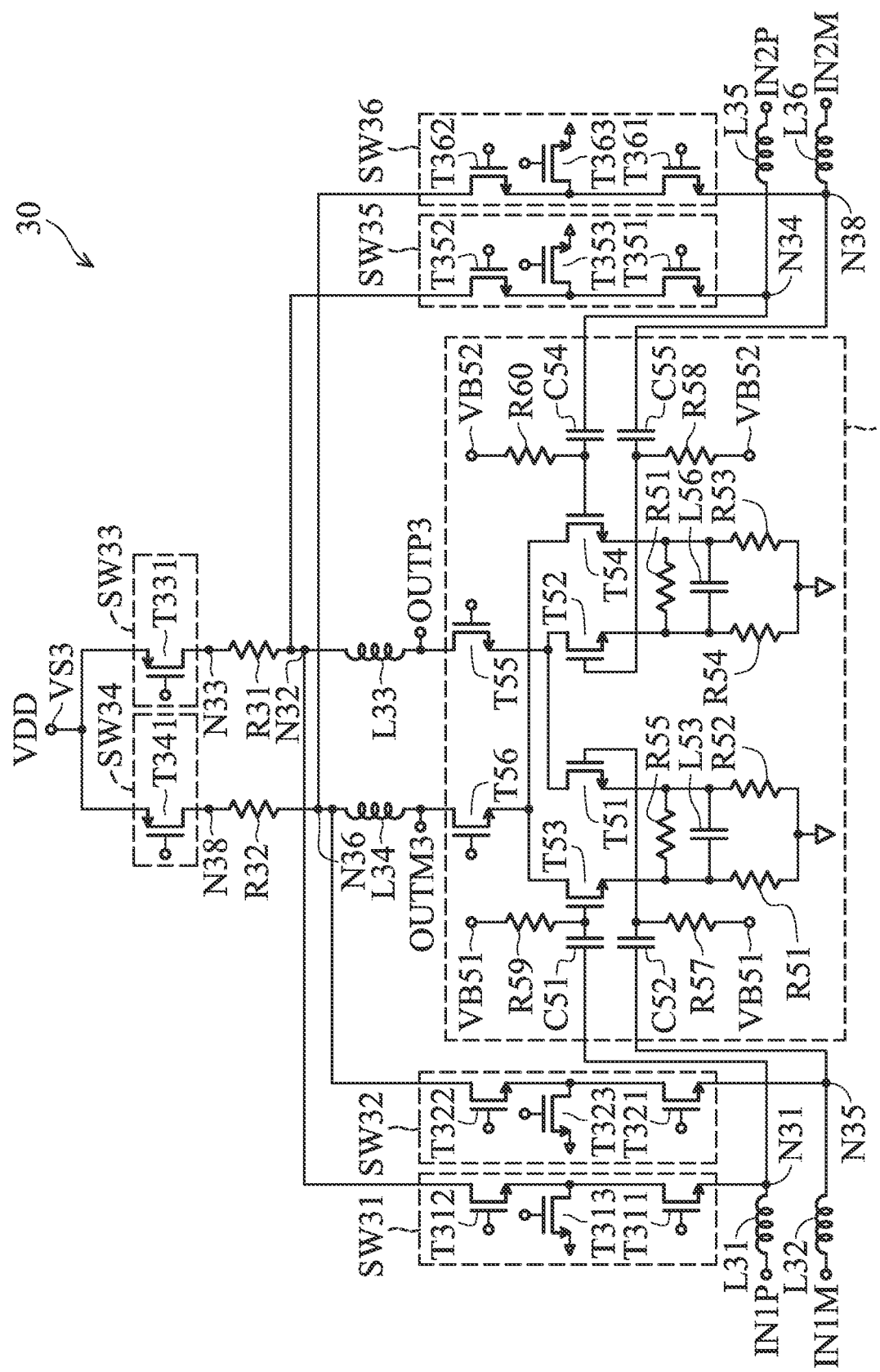
FIG. 5 shows another exemplary embodiment of a two-to-one multiplexer.

FIG. 5 shows a detailed structure of the path circuit 30 of the two-to-one multiplexer 3. Each of the switches SW31, SW32, SW35, and SW36 is implemented by a T switch. As shown in FIG. 5, the switch SW31 comprises N-type transistors T311~T313, and the switch SW32 comprises N-type transistors T321~T323. The gates of the transistors T311~T312 and T321~T322 receive the switch signal S31, and the gates of the transistors T313 and T323 receive a signal which is inverse to the switch signal S31. The switch SW35 comprises N-type transistors T351~T353, and the switch SW36 comprises N-type transistors T361~T363. The gates of the transistors T351~T352 and T361~T362 receive the switch signal S33, and the gates of the transistors T353 and T363 receive a signal which is inverse to the switch signal S33. The switch SW33 comprises a P-type transistor T331, and the switch SW34 comprises a P-type transistor T341. The gates of the transistors T331 and T341 receive the switch signal S32.

In the embodiment of FIG. 5, the amplifiers A31~A32 are combined together and implemented by a circuit 50. As shown in FIG. 5, the circuit 50 comprises N-type transistors T51~T56, capacitors C51~C56, resistors R51~R58, and bias terminals VB51~VB52. When a bias voltage is provided to the terminal VB51 and the transistors T55~T56 are turned on, the amplifier A31 is enabled; otherwise, the amplifier A31 is disabled. When a bias voltage is provided to the terminal VB52 and the transistors T55~T56 are turned on, the amplifier A32 is enabled; otherwise, the amplifier A32 is disabled.

Figure 6A:
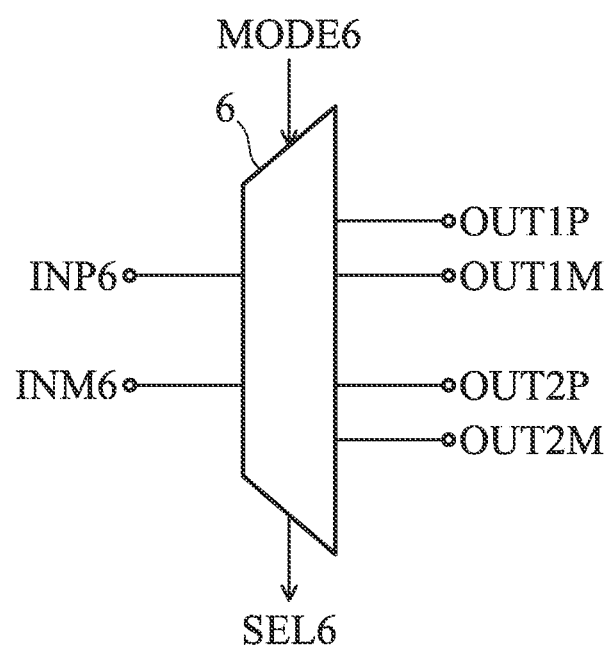
FIGS. 6A~6C show one exemplary embodiment of a one-to-two multiplexer.
Figure 6B:
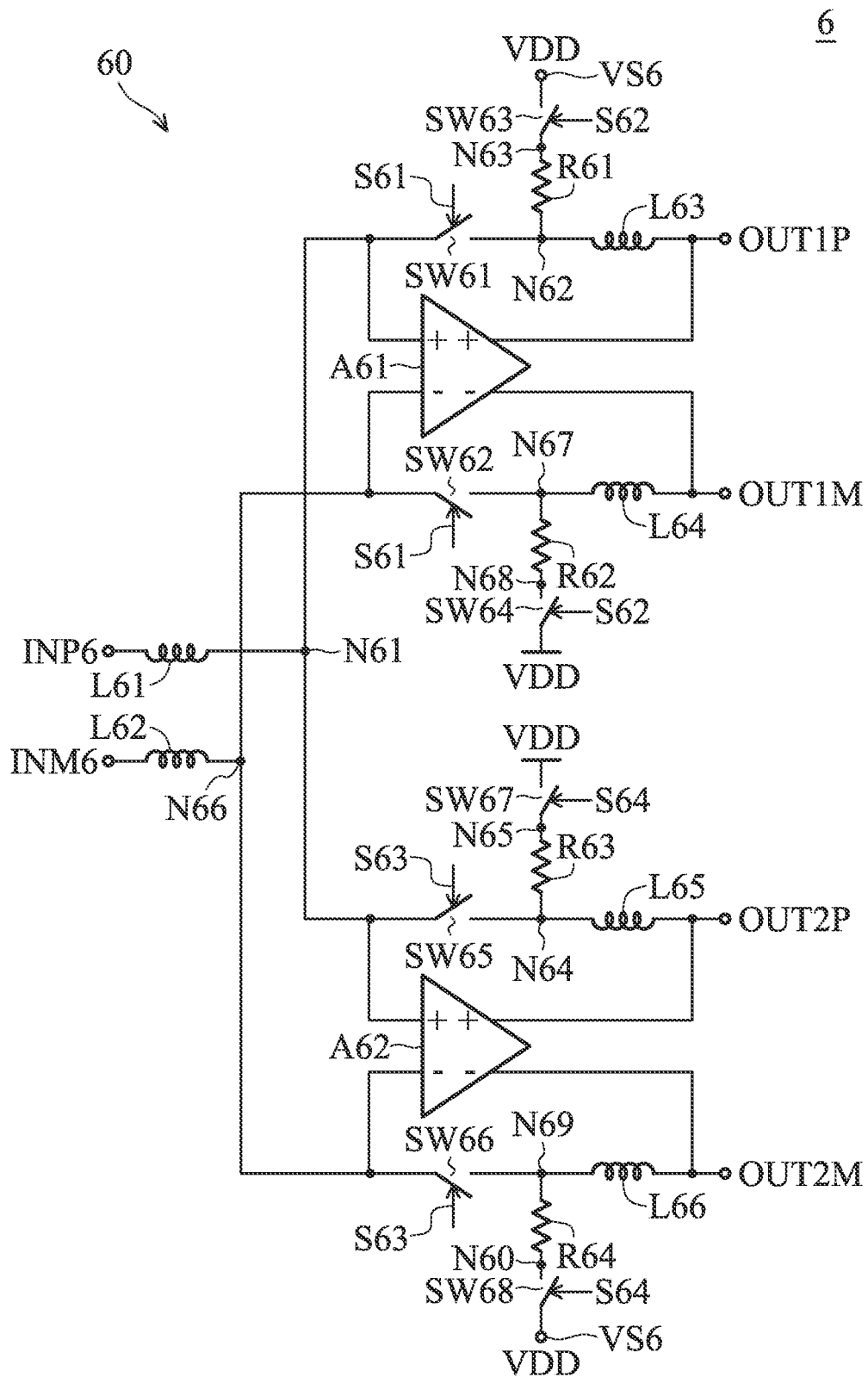
Figure 6C:
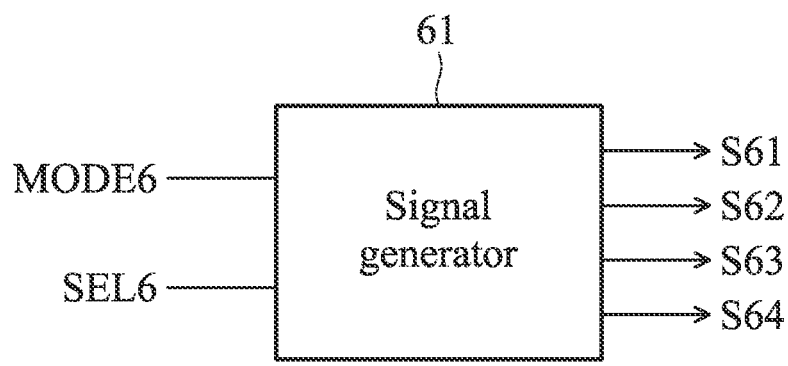

In an embodiment, the structure and operation of the buffer shown in FIGS. 1A~1B can applied in a one-to-two multiplexer. FIGS. 6A~6B show an exemplary embodiment of a one-to-two multiplexer. As shown in FIG. 3A, a one-to-two multiplexer 6 comprises a pair of signal input terminals INP6 and INM6, a pair of signal output terminals OUT1P and OUT1M, a pair of signal output terminal OUT2P and OUT2M, and a path circuit 60. The signal input terminals INP6 and INM6 are configured to receive a differential input signal, wherein a positive element signal of this differential input signal is received by the signal input terminal INP6, while a negative element signal thereof is received by the signal input terminal INM6. According to a selection signal SEL6, the one-to-two multiplexer 6 operates at a first selection state to transmit the differential input signal at the pair of signal input terminals INP6 and INM6 to the pair of signal output terminal OUT1P and OUT1M or at a second selection state to transmit the differential input signal at the pair of signal input terminals INP6 and INM6 to the pair of signal output terminal OUT2P and OUT2M as a differential output signal. Moreover, the one-to-two multiplexer 6 may be controlled by a mode signal MODE6 to selectively operate at a passive mode or an active mode according to the frequency of the differential input signal. When the data rate of the differential input signal is high, the one-to-two multiplexer 6 operates at the active; when the data rate of the differential input signal is low, the one-to-two multiplexer 6 operates at the passive mode for reducing consumption.

Referring to FIG. 6B, the path circuit 60 comprises inductors L61~L66, switches SW61~SW68, resistors R61~R62, and amplifiers A61~A62. The inductor L61 is coupled between the signal input terminal INP6 and a node N61. The switch SW61 is coupled between the node N61 and a node N62. The inductor L63 is coupled between the node N32 and the signal output terminal OUT1P. The switch SW63 is coupled between the voltage source terminal VS6 and a node N63. During the operation of the one-to-two multiplexer 6, an operation voltage VDD is provided to the voltage source terminal VS6. The resistor R61 is coupled between the node N63 and the node N62. The inductor L62 is coupled between the signal input terminal INM7 and the node N66. The switch SW62 is coupled between the node N66 and a node N67. The inductor L64 is coupled between the node N67 and the signal output terminal OUT1M. The switch SW64 is coupled between the voltage source terminal VS6 and a node N68. The resistor R62 is coupled between the node N68 and the node N67. A positive input terminal (+) of the amplifier A61 is coupled to the node N61, and a negative input terminal (−) thereof is coupled to the node N66. A positive output terminal (+) of the amplifier A61 is coupled to the signal output terminal OUT1P, and a negative output terminal (−) thereof is coupled to the signal output terminal OUT1M.

The switch SW65 is coupled between the node N61 and the node N64. The inductor L65 is coupled between the node N64 and the signal output terminal OUT2P. The switch SW67 is coupled between the voltage source terminal VS6 and a node N65. The resistor R63 is coupled between the node N65 and the node N64. The switch SW66 is coupled between the node N66 and the node N69. The inductor L66 is coupled between the node N69 and the signal output terminal OUT2P. The switch SW68 is coupled between the voltage source terminal VS6 and a node N80. The resistor R66 is coupled between the node N60 and the node N69. A positive input terminal (+) of the amplifier A62 is coupled to the node N61, and a negative input terminal (−) thereof is coupled to the node N66. A positive output terminal (+) of the amplifier A62 is coupled to the signal output terminal OUT2P, and a negative output terminal (−) thereof is coupled to the signal output terminal OUT2M.

In the embodiment, the switches SW61 and SW62 are controlled by a switch signal S61, the switches SW63 and SW64 are controlled by a switch signal S62, the switches SW65 and SW66 are controlled by a switch signal S63, and the switches SW67 and SW68 are controlled by a switch signal S64. The one-to-two multiplexer 6 may further comprise a signal generator 61 which operates to generate the switch signal S61~S64 based on the selection signal SEL6 and the mode signal MODE6. The selection signal SEL6 indicates which pair of signal output terminals the differential input signal is transmitted to, and the mode signal MODE6 indicates which one of the passive mode and the active mode the one-to-two multiplexer 6 operates at according to the frequency of the differential input signal.

Figure 7A:
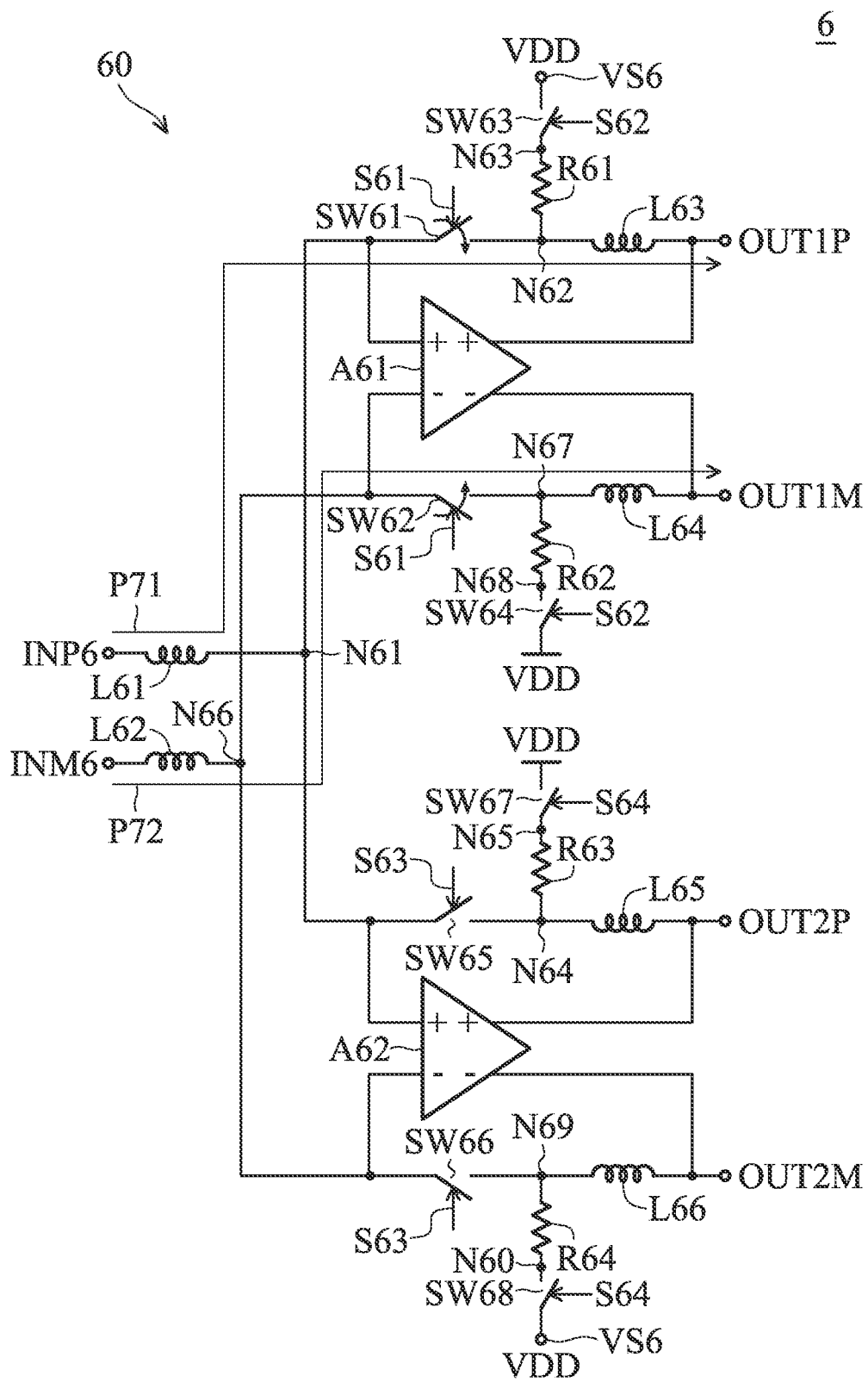
FIGS. 7A~7D shows an exemplary embodiment of an operation of the one-to-two multiplexer of FIGS. 6A~6C at a passive mode and an active mode.

Referring to FIG. 7A, when the one-to-two multiplexer 6 operates simultaneously at the first selection state (for transmitting the differential input signal to the pair of signal output terminals OUT1P and OUT1M) and at the passive mode, the switches SW61 and SW62 are turned on according to the switch signal S61, the switches SW63 and SW64 are turned off according to the switch signal S62, the switches SW65 and SW66 are turned off according to the switch signal S63, and the switches SW67 and SW68 are turned off according to the switch signal S64. Moreover, the amplifier A61 and A62 are disabled. Since the switches SW61 is turned on, there is a signal transmission path P71 is formed in the path circuit 60 and between the signal input terminal INP6 and the signal output terminal OUT1P for the positive element signal of the differential input signal at the signal input terminal INP6. Since the switch SW62 is turned on, there is a signal transmission path P62 is formed in the path circuit 60 and between the signal input terminal INM6 and the signal output terminal OUT1M for the negative element signal at the signal input terminal INM6. As shown in FIG. 7A, the switches SW63 and SW64 are turned off, and each of the signal transmission paths P71 and P72 is disconnected from the voltage source terminal VS6. The components L61~L64 and SW61~SW62 in the signal transmission paths P71 and P72 are passive elements. Thus, no DC power consumption is required simultaneously at the first selection state and at the passive mode.

Figure 7B:
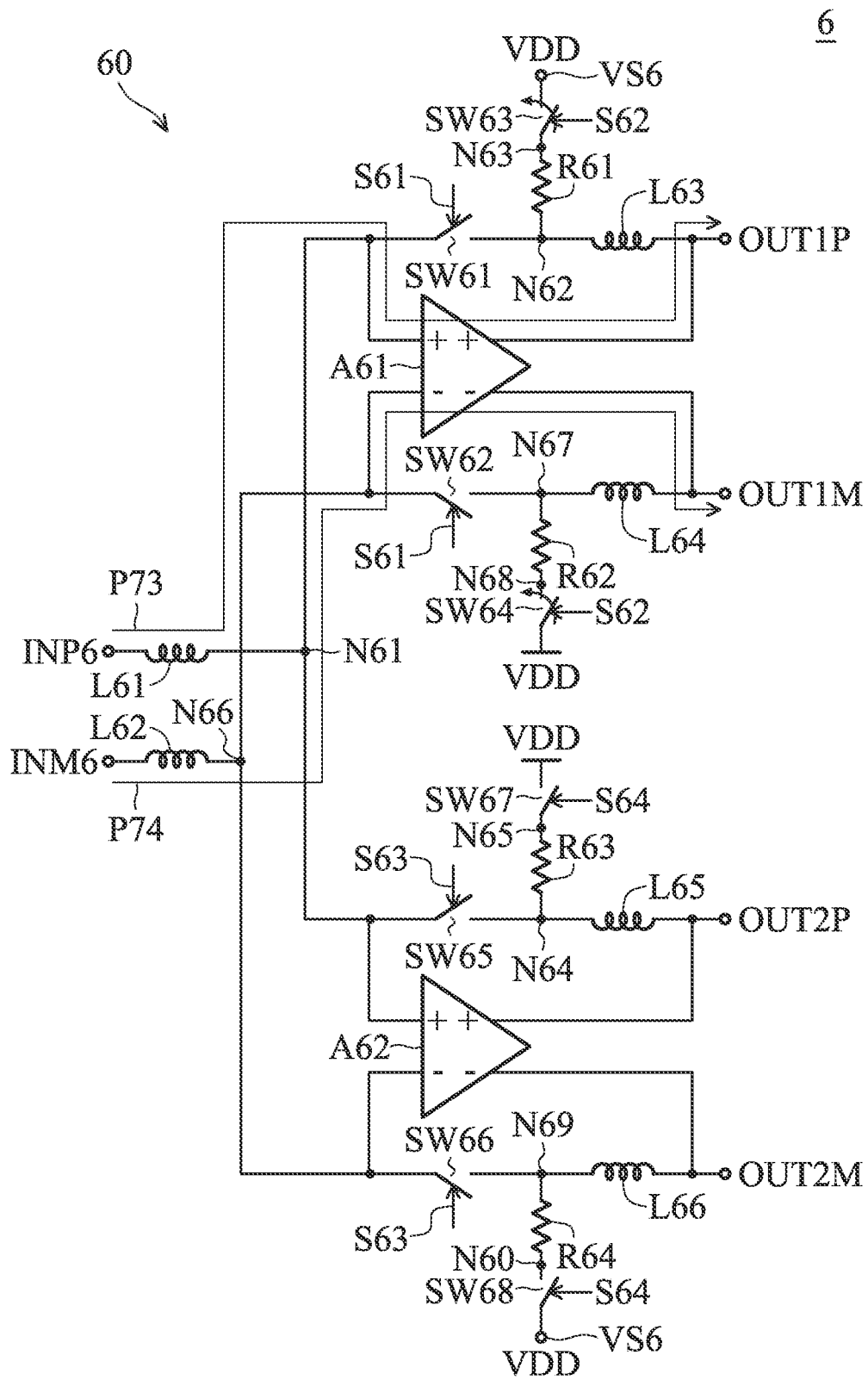

Referring to FIG. 7B, when the one-to-two multiplexer 6 operates simultaneously at the first selection state and at the active mode, the switches SW61 and SW62 are turned off according to the switch signal S61, the switches SW63 and SW64 are turned on according to the switch signal S62, the switches SW65 and SW66 are turned off according to the switch signal S64, and the switches SW67 and SW68 are turned off according to the switch signal S64. Moreover, the amplifier A61 is enabled, while the amplifier A62 is disabled. Since the switch SW61 is turned off and the amplifier A61 is enabled, there is a signal transmission path P73 is formed in the path circuit 60 and between the signal input terminal INP6 and the signal output terminal OUT1P for the positive element signal at the signal input terminal INP6. Since the switch SW62 is turned off and the amplifier A61 is enabled, there is a signal transmission path P74 is formed in the path circuit 60 and between the signal input terminal INM6 and the signal output terminal OUT1M for the negative element signal at the signal input terminal INM6. As shown in FIG. 7B, the switches SW63 and SW64 are turned on. Thus, a DC current is provided from the voltage source terminal VS6 to the signal transmission path P73 through the switch SW63, the resistor R61 and the inductor L63, and a DC current is provided from the voltage source terminal VS6 to the signal transmission path P74 through the switch SW63, the resistor R62 and the inductor L64, which induces DC power consumption.

Figure 7C:
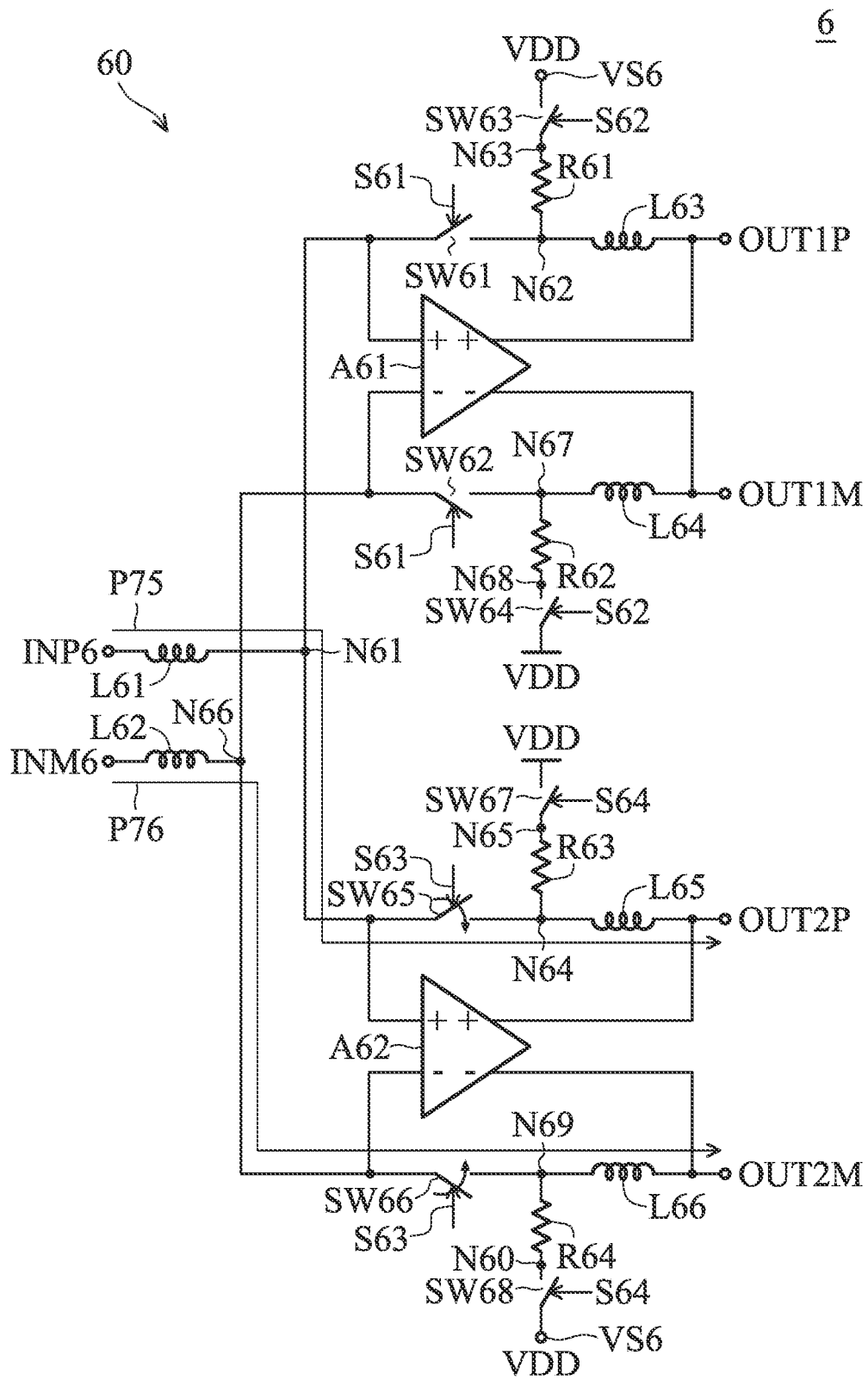

Referring to FIG. 7C, when the one-to-two multiplexer 6 operates simultaneously at the second selection state (for transmitting the differential input signal to the pair of signal input terminals OUT2P and OUT2M) and at the passive mode, the switches SW65 and SW66 are turned on according to the switch signal S63, the switches SW67 and SW67 are turned off according to the switch signal S64, the switches SW61 and SW62 are turned off according to the switch signal S61, and the switches SW63 and SW64 are turned off according to the switch signal S62. Moreover, the amplifier A61 and A62 are disabled. Since the switches SW65 is turned on, there is a signal transmission path P75 is formed in the path circuit 60 and between the signal input terminal INP6 and the signal output terminal OUT2P for the positive element signal of the differential input signal at the signal input terminals INP6. Since the switch SW66 is turned on, there is a signal transmission path P76 is formed in the path circuit 60 and between the signal input terminal INM6 and the signal output terminal OUT2M for the negative element signal at the signal input terminal INM6. As shown in FIG. 7C, the switches SW67 and SW68 are turned off, and each of the signal transmission paths P75 and P76 is disconnected from the voltage source terminal VS7. The components L61~L62 and L65~L66 and SW35~SW36 in the signal transmission paths P75 and P76 are passive elements. Thus, no DC power consumption is required simultaneously at the first selection state and at the passive mode.

Figure 7D:
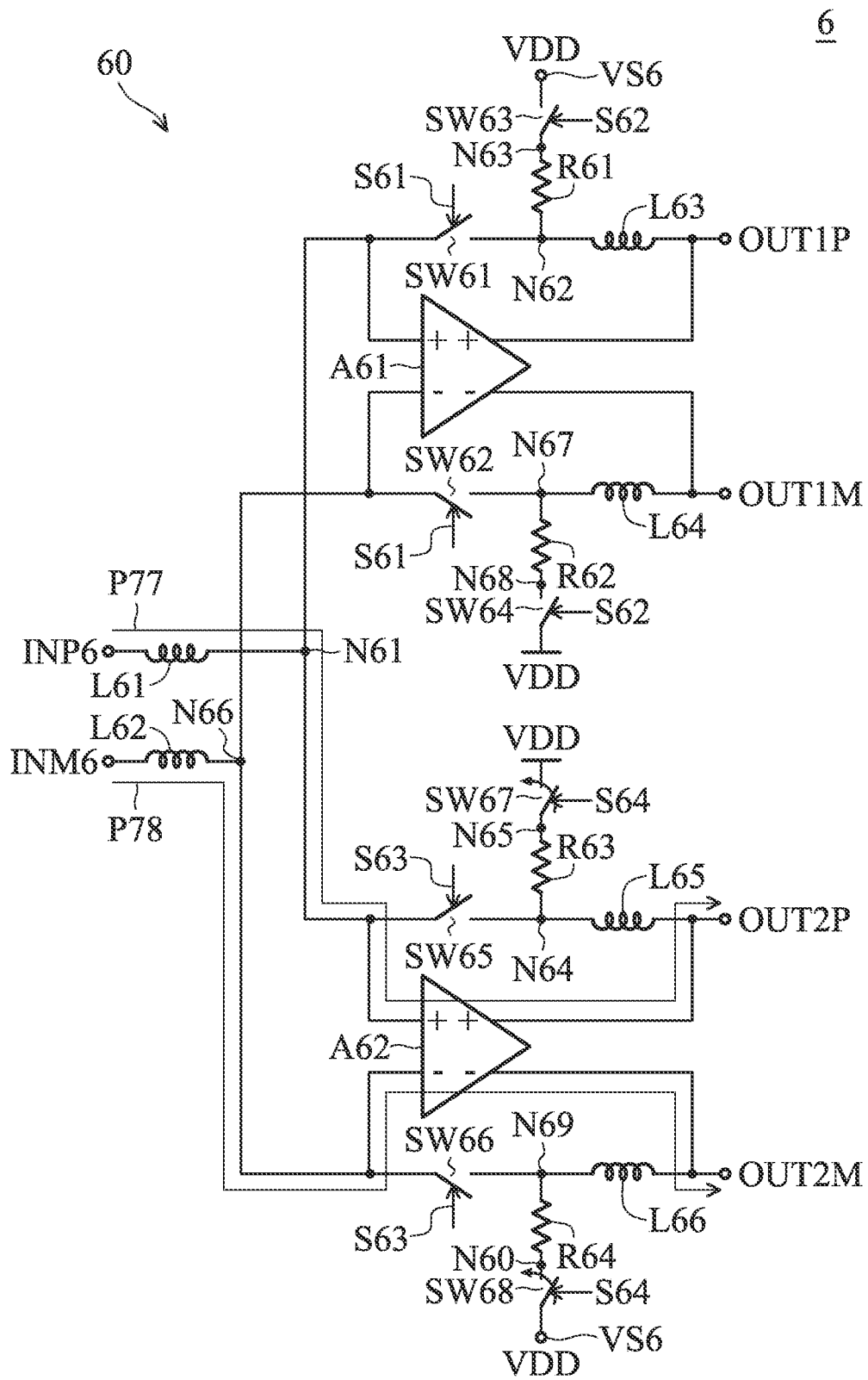

Referring to FIG. 7D, when the one-to-two multiplexer 6 operates simultaneously at the second selection state and at the active mode, the switches SW65 and SW66 are turned off according to the switch signal S73, the switches SW67 and SW67 are turned on according to the switch signal S64, the switches SW61 and SW62 are turned off according to the switch signal S61, and the switches SW63 and SW64 are turned off according to the switch signal S62. Moreover, the amplifier A62 is enabled, while the amplifier A61 is disabled. Since the switch SW65 is turned off and the amplifier A62 is enabled, there is a signal transmission path P87 is formed in the path circuit 60 and between the signal input terminal INP6 and the signal output terminal OUT2P for the positive element signal at the signal input terminal INP6. Since the switch SW66 is turned off and the amplifier A62 is enabled, there is a signal transmission path P78 is formed in the path circuit 60 and between the signal input terminal INM6 and the signal output terminal OUT2M for the negative element signal at the signal input terminal INM6. As shown in FIG. 7D, the switches SW67 and SW68 are turned on. Thus, a DC current is provided from the voltage source terminal VS6 to the signal transmission path P77 through the switch SW67, the resistor R63 and the inductor L65, and a DC current is provided from the voltage source terminal VS6 to the signal transmission path P78 through the switch SW68, the resistor R64 and the inductor L66, which induces DC power consumption.

According to the above embodiment, the one-to-two multiplexer 6 can selectively operate at two different modes: a passive mode and an active mode. In cases where the one-to-two multiplexer 6 is applied in a high speed device, when the high speed device operates a low data rate for a low frequency differential input signal, the one-to-two multiplexer 6 switches to operate at the passive mode to provide a specific signal transmission path for the low frequency differential input signal. The specific signal transmission path is disconnected from the voltage source terminal VS6, and only passive components are in the specific signal transmission path. Thus, no DC current is induced, which eliminates DC power consumption.

Figure 8:
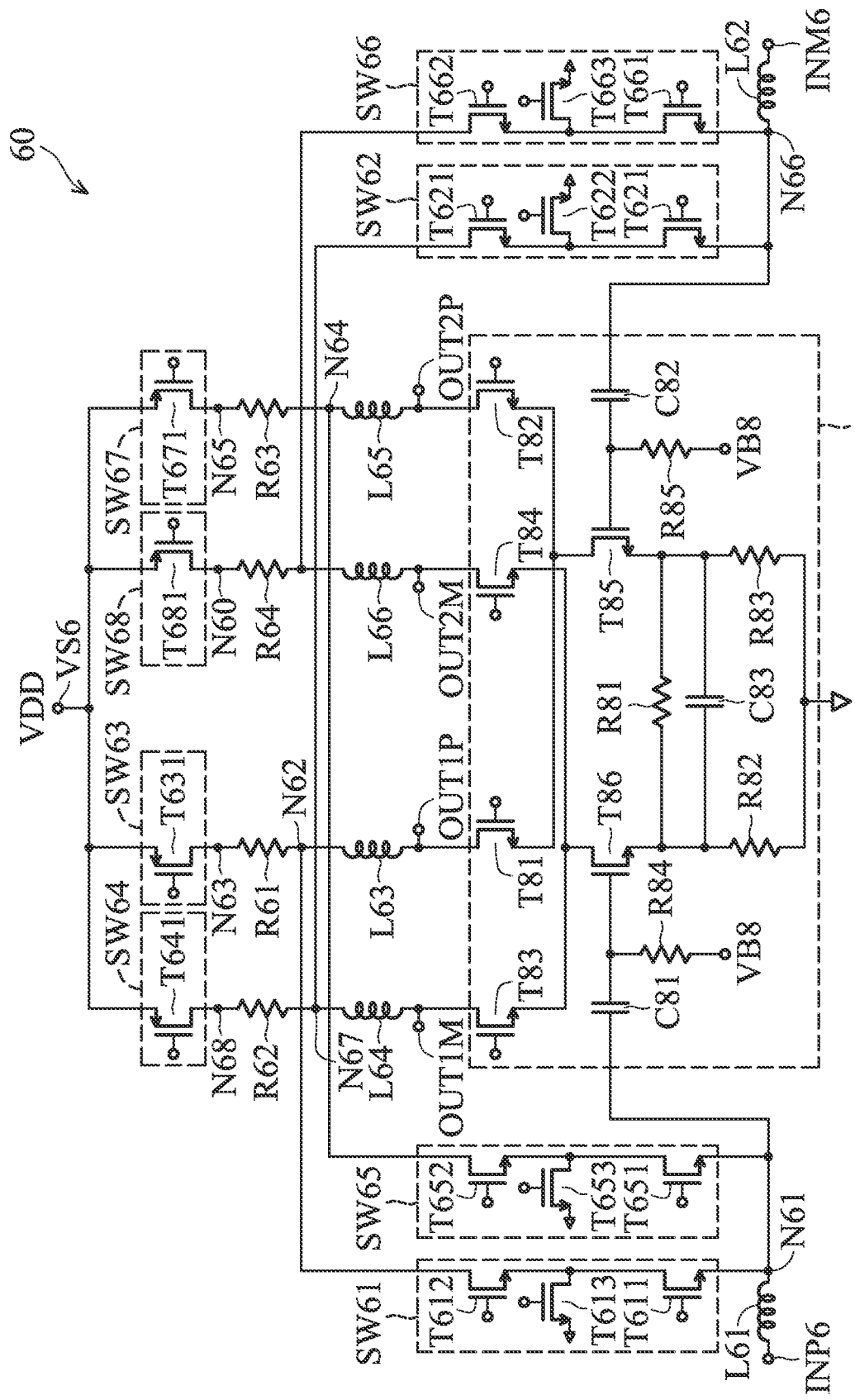
FIG. 8 shows another exemplary embodiment of a one-to-two multiplexer.

FIG. 8 shows a detailed structure of the path circuit 60 of the one-to-two multiplexer 6. Each of the switches SW61, SW62, SW65, and SW66 is implemented by a T switch. As shown in FIG. 8, the switch SW61 comprises N-type transistors T611~T613, and the switch SW62 comprises N-type transistors T621~T623. The gates of the transistors T611~T612 and T621~T622 receive the switch signal S61, and the gates of the transistors T613 and T623 receive a signal which is inverse to the switch signal S61. The switch SW65 comprises N-type transistors T651~T653, and the switch SW66 comprises N-type transistors T661~T663. The gates of the transistors T651~T652 and T661~T662 receive the switch signal S63, and the gates of the transistors T653 and T663 receive a signal which is inverse to the switch signal S63. The switch SW63 comprises a P-type transistor T631, and the switch SW64 comprises a P-type transistor T641. The gates of the transistors T631 and T641 receive the switch signal S62. The switch SW67 comprises a P-type transistor T671, and the switch SW68 comprises a P-type transistor T681. The gates of the transistors T671 and T681 receive the switch signal S64.

In the embodiment of FIG. 8, the amplifiers A61~A62 are combined together and implemented by a circuit 80. As shown in FIG. 8, the circuit 80 comprises N-type transistors T81~T586 capacitors C81~C83, resistors R81~R85, and a bias terminal VB8. When a bias voltage is provided to the terminal VB8 and the transistors T81 and T83 are turned on, the amplifier A61 is enabled; otherwise, the amplifier A61 is disabled. When a bias voltage is provided to the terminal VB8 and the transistors T82 and T84 are turned on, the amplifier A62 is enabled; otherwise, the amplifier A62 is disabled.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A buffer selectively operating at a first mode or a second mode, comprising:
   a first signal input terminal;
   a first signal output terminal; and
   a path circuit, coupled between the first signal input terminal and the first signal output terminal, having a voltage source terminal, and having an amplifier disabled at the first mode and enabled at the second mode;
   wherein in response to the buffer operating at the first mode, a first signal transmission path without passing through the disabled amplifier is formed in the path circuit and between the first signal input terminal and the first signal output terminal, and
   wherein the first signal transmission path is disconnected from the voltage source terminal.

2. The buffer as claimed in claim 1,
   wherein in response to the buffer operating at the second mode, a second signal transmission path passing through the enabled amplifier is formed in the path circuit and between the first signal input terminal and the first signal output terminal, and
   wherein a direct current is provided from the voltage source terminal to the second signal transmission path.

3. The buffer as claimed in claim 1, wherein the first circuit comprises:
   a first inductor coupled between the first signal input terminal and a first node;
   a first switch coupled between the first node and a second node;
   a second inductor coupled between the second node and the first signal output terminal;
   a second switch coupled between the voltage source terminal and a third node; and
   a first resistor coupled between the third node and the second node;
   wherein the amplifier has a first input terminal coupled to the first node and a first output terminal coupled to the first signal output terminal,
   wherein in response to the buffer operating at the first mode, the first switch is turned on, the second switch is turned off, and the amplifier is disabled, and
   wherein at the first mode, the first inductor, the first switch, and the second inductor are in the first signal transmission path.

4. The buffer as claimed in claim 3, wherein in response to the buffer operating at the second mode, the first switch is turned off, the second switch is turned on, and the amplifier is enabled.

5. The buffer as claimed in claim 3, further comprising:
   a second signal input terminal; and
   a second signal output terminal;
   wherein the path circuit is further coupled between the second signal input terminal and the second signal output terminal and further comprises:
   a third inductor coupled between the second signal input terminal and a fourth node;
   a third switch coupled between the fourth node and a fifth node;
   a fourth inductor coupled between the fifth node and the second signal output terminal;
   a fourth switch coupled between the voltage source terminal and a sixth node; and
   a second resistor coupled between the sixth node and the fifth node,
   wherein the amplifier further has a second input terminal coupled to the fourth node and a second output terminal coupled to the second signal output terminal,
   wherein in response to the buffer operating at the first mode, the third switch is turned on, and the fourth switch is turned off, and
   wherein in response to the buffer operating at the second mode, the third switch is turned off, and the fourth switch is turned on.

6. The buffer as claimed in claim 5, wherein the first and second signal input terminals receive a differential input signal.

7. A multiplexer selectively operating at a first selection state or a second selection state and selectively operating at a first transmission mode or a second transmission mode, comprising:
   a first signal input terminal;
   a second signal input terminal;
   a first signal output terminal; and
   a path circuit, coupled between the first and second signal input terminals and the first signal output terminal, having a voltage source terminal, and having a first amplifier and a second amplifier which are disabled at the first transmission mode and selectively enabled at the second transmission mode;
   wherein in response to the multiplexer operating simultaneously at the first selection state and at the first transmission mode, a first signal transmission path is formed in the path circuit and between the first signal input terminal and the first signal output terminal without passing through the disabled first and second amplifiers, and the first signal transmission path is disconnected from the voltage source terminal, and
   wherein in response to the multiplexer operating simultaneously at the second selection state and at the first transmission mode, a second signal transmission path is formed in the path circuit and between the second signal input terminal and the first signal output terminal without passing through the disabled first and second amplifiers, and the second signal transmission path is disconnected from the voltage source terminal.

8. The multiplexer as claimed in claim 7,
wherein in response to the multiplexer operating simultaneously at the first selection state and at the second transmission mode, a third signal transmission path passing through the enabled first amplifier is formed in the path circuit and between the first signal input terminal and the first signal output terminal, and a direct current is provided from the voltage source terminal to the third signal transmission path, and
wherein in response to the multiplexer operating simultaneously at the second selection state and at the second transmission mode, a fourth signal transmission path passing through the enabled second amplifier is formed in the path circuit and between the second signal input terminal and the first signal output terminal, and a direct current is provided from the voltage source terminal to the fourth signal transmission path.

9. The multiplexer as claimed in claim 7, further comprising:
a first inductor coupled between the first signal input terminal and a first node;
a first switch coupled between the first node and a second node;
a second inductor coupled between the second node and the first signal output terminal;
a second switch coupled between the voltage source terminal and a third node;
a first resistor coupled between the third node and the second node;
a third inductor coupled between the second signal input terminal and a fourth node;
a third switch coupled between the fourth node and the second node;
wherein the first amplifier has a first input terminal coupled to the first node, and a first output terminal coupled to the first signal output terminal;
wherein the second amplifier has a first input terminal coupled to the fourth node, and a first output terminal coupled to the first signal output terminal,
wherein in response to the multiplexer operating simultaneously at the first selection state and at the first transmission mode, the first switch is turned on, the second and third switches are turned off, the first and second amplifiers are disabled, and the first inductor, the first switch, and the second inductor are in the first signal transmission path, and
wherein in response to the multiplexer operating simultaneously at the second selection state and at the first transmission mode, the first and second switches are turned off, the third switch is turned on, the first and second amplifiers are disabled, and the third inductor, the third switch, and the second inductor are in the second signal transmission path.

10. The multiplexer as claimed in claim 9, in response to the multiplexer operating at the second transmission mode, the first and third switches are turned off, the second switch is turned on, and one of the first and second amplifiers is enabled.

11. The multiplexer as claimed in claim 9, further comprising:
a third signal input terminal;
a fourth signal input terminal; and
a second signal output terminal;
wherein the path circuit is further coupled between the third and fourth signal input terminals and the second signal output terminal and further comprises:
a fourth inductor coupled between the third signal input terminal and a fifth node;
a fourth switch coupled between the fifth node and a sixth node;
a fifth inductor coupled between the sixth node and the second signal output terminal;
a fifth switch coupled between the voltage source terminal and a seventh node;
a second resistor coupled between the seventh node and the sixth node,
a sixth inductor coupled between the fourth signal input terminal an eighth node;
a sixth switch coupled between the eighth node and the sixth node;
wherein the first amplifier further has a second input terminal coupled to the fifth node and a second output terminal coupled to the second signal output terminal,
wherein the second amplifier further has a second input terminal coupled to the eighth node and a second output terminal coupled to the second signal output terminal,
wherein in response to the multiplexer operating simultaneously at the first selection state and at the first transmission mode, the fourth switch is turned on, and the fifth and sixth switches are turned off, and
wherein in response to the multiplexer operating simultaneously at the second selection state and at the first transmission mode, the fourth and fifth switches are turned off, and the sixth switch is turned on.

12. The multiplexer as claimed in claim 11,
wherein in response to the multiplexer operating simultaneously at the first selection state and at the second transmission mode, the first, third, fourth, and sixth switches are turned off, the second and fifth switches are turned on, the first amplifier is enabled, and the second amplifier is disabled, and
wherein in response to the multiplexer operating simultaneously at the second selection state and at the second transmission mode, the first, third, fourth, and sixth switches are turned off, the second and fifth switches are turned on, the first amplifier is disabled, and the second amplifier is enabled.

13. The multiplexer as claimed in claim 11, wherein at least one of the first, third, fourth, and sixth switches is implemented by a T-type switch.

14. A multiplexer selectively operating at a first selection state or a second selection state and selectively operating at a first transmission mode or a second transmission mode, comprising:
a first signal input terminal;
a first signal output terminal;
a second signal output terminal; and
a path circuit, coupled between the first signal input terminal and the first and second signal output terminals, having a voltage source terminal, and having a first amplifier and a second amplifier which are disabled at the first transmission mode and selectively enabled at the second transmission mode;
wherein in response to the multiplexer operating simultaneously at the first selection state and at the first transmission mode, a first signal transmission path is formed in the path circuit and between the first signal input terminal and the first signal output terminal without passing through the disabled first and second amplifiers, and the first signal transmission path is disconnected from the voltage source terminal, and wherein in response to the multiplexer operating simultaneously at the second selection state and at the first transmission mode, a second signal transmission path is formed in the path circuit and between the first signal input terminal and the second signal output terminal without passing through the disabled first and second amplifiers, and the second signal transmission path is disconnected from the voltage source terminal.

15. The multiplexer as claimed in claim 14, wherein in response to the multiplexer operating simultaneously at the first selection state and at the second transmission mode, a third signal transmission path passing through the enabled first amplifier is formed in the path circuit and between the first signal input terminal and the first signal output terminal, and a direct current is provided from the voltage source terminal to the third signal transmission path, and wherein in response to the multiplexer operating simultaneously at the second selection state and at the second transmission mode, a fourth signal transmission path passing through the enabled second amplifier is formed in the path circuit and between the first signal input terminal and the second signal output terminal, and a direct current is provided from the voltage source terminal to the fourth signal transmission path.

16. The multiplexer as claimed in claim 14, further comprising:
a first inductor coupled between the first signal input terminal and a first node;
a first switch coupled between the first node and a second node;
a second inductor coupled between the second node and the first signal output terminal;
a second switch coupled between the voltage source terminal and a third node;
a first resistor coupled between the third node and the second node;
a third switch coupled between the first node and a fourth node;
a third inductor coupled between the fourth node and the second signal output terminal;
a fourth switch coupled between the voltage source terminal and a fifth node;
a second resistor coupled between the fifth node and the fourth node;
wherein the first amplifier has a first input terminal coupled to the first node, and a first output terminal coupled to the first signal output terminal;
wherein the second amplifier has a first input terminal coupled to the first node, and a first output terminal coupled to the second signal output terminal,
wherein in response to the multiplexer operating simultaneously at the first selection state and at the first transmission mode, the first switch is turned on, the second, third, and fourth switches are turned off, the first and second amplifiers are disabled, and the first inductor, the first switch, and the second inductor are in the first signal transmission path, and
wherein in response to the multiplexer operating simultaneously at the second selection state and at the first transmission mode, the first, second, and fourth switches are turned off, the third switch is turned on, the first and second amplifiers are disabled, and the first inductor, the third switch, and the third inductor are in the second signal transmission path.

17. The multiplexer as claimed in claim 16, in response to the multiplexer operating at the second transmission mode, the first and third switches are turned off, the second and fourth switches are turned on, and one of the first and second amplifiers is enabled.

18. The multiplexer as claimed in claim 16, further comprising:
a second signal input terminal;
a third signal output terminal; and
a fourth signal output terminal;
wherein the path circuit is further coupled between the second signal input terminal and the third and fourth signal output terminals and further comprises:
a fourth inductor coupled between the second signal input terminal and a sixth node;
a fifth switch coupled between the sixth node and a seventh node;
a fifth inductor coupled between the seventh node and the third signal output terminal;
a sixth switch coupled between the voltage source terminal and an eighth node;
a third resistor coupled between the eighth node and the seventh node,
a sixth switch coupled between the sixth node and a ninth node;
a sixth inductor coupled between the ninth node and the fourth signal output terminal;
an eight switch coupled between the voltage source terminal and a tenth node;
a fourth resistor coupled between the tenth node and the ninth node;
wherein the first amplifier further has a second input terminal coupled to the sixth node and a second output terminal coupled to the third signal output terminal;
wherein the second amplifier further has a second input terminal (coupled to the sixth node and a second output terminal coupled to the fourth signal output terminal,
wherein in response to the multiplexer operating simultaneously at the first selection state and at the first transmission mode, the fifth switch is turned on, and the sixth, seventh, and eighth switches are turned off, and
wherein in response to the multiplexer operating simultaneously at the second selection state and at the first transmission mode, the fifth, sixth, and eight switches are turned off, and the seventh switch is turned on.

19. The multiplexer as claimed in claim 18,
wherein in response to the multiplexer operating simultaneously at the first selection state and at the second transmission mode, the first, third, fourth, fifth, seventh, and eight switches are turned off, the second and sixth switches are turned on, the first amplifier is enabled, and the second amplifier is disabled, and
wherein in response to the multiplexer operating simultaneously at the second selection state and at the second transmission mode, the first, second, third, fifth, sixth, and seventh switches are turned off, the fourth and eighth switches are turned on, the first amplifier is disabled, and the second amplifier is enabled.

20. The multiplexer as claimed in claim 18, wherein at least one of the first, third, fifth, and seventh switches is implemented by a T-type switch.

\* \* \* \* \*